United States Patent
Yun et al.

(10) Patent No.: US 7,911,011 B2
(45) Date of Patent: Mar. 22, 2011

(54) METHODS OF FABRICATING ELECTROMECHANICAL NON-VOLATILE MEMORY DEVICES

(75) Inventors: Eun-Jung Yun, Seoul (KR); Sung-Young Lee, Gyeonggi-do (KR); Min-Sang Kim, Seoul (KR); Sung-Min Kim, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/693,783

(22) Filed: Jan. 26, 2010

(65) Prior Publication Data

US 2010/0129976 A1    May 27, 2010

Related U.S. Application Data

(63) Continuation of application No. 11/876,111, filed on Oct. 22, 2007, now Pat. No. 7,675,142.

(30) Foreign Application Priority Data

Oct. 23, 2006 (KR) ................................. 2006-102696

(51) Int. Cl.
*H01L 29/84* (2006.01)
(52) U.S. Cl. ................. 257/415; 257/619; 257/E29.309; 257/E21.657; 438/53
(58) Field of Classification Search .................. 257/415, 257/619, 21.657, E29.309, E21.657; 438/53
See application file for complete search history.

(56) References Cited

U.S. PATENT DOCUMENTS

| | | | |
|---|---|---|---|
| 6,100,109 A * | 8/2000 | Melzner et al. | 438/53 |
| 6,924,538 B2 | 8/2005 | Jaiprakash et al. | |
| 7,304,357 B2 | 12/2007 | Jaiprakash et al. | 257/415 |
| 2006/0128049 A1 * | 6/2006 | Jaiprakash et al. | 438/53 |
| 2007/0015303 A1 * | 1/2007 | Bertin et al. | 438/50 |
| 2008/0048246 A1 | 2/2008 | Yun et al. | 257/324 |
| 2008/0049491 A1 | 2/2008 | Park | 365/164 |
| 2008/0099860 A1 | 5/2008 | Wuertz | 257/415 |

* cited by examiner

*Primary Examiner* — Allan R Wilson
(74) *Attorney, Agent, or Firm* — Myers Bigel Sibley & Sajovec

(57) ABSTRACT

Electromechanical non-volatile memory devices are provided including a semiconductor substrate having an upper surface including insulation characteristics. A first electrode pattern is provided on the semiconductor substrate. The first electrode pattern exposes portions of a surface of the semiconductor substrate therethrough. A conformal bit line is provided on the first electrode pattern and the exposed surface of semiconductor substrate. The bit line is spaced apart from a sidewall of the first electrode pattern and includes a conductive material having an elasticity generated by a voltage difference. An insulating layer pattern is provided on an upper surface of the bit line located on the semiconductor substrate. A second electrode pattern is spaced apart from the bit line and provided on the insulating layer pattern. The second electrode pattern faces the first electrode pattern. Related methods are also provided.

17 Claims, 14 Drawing Sheets

METHODS OF FABRICATING ELECTROMECHANICAL NON-VOLATILE MEMORY DEVICES

CLAIM OF PRIORITY

This application is a continuation of U.S. application Ser. No. 11/876,111, filed Oct. 22, 2007, now U.S. Pat. No. 7,675,142 which claims priority to Korean Patent Application No. 2006-102696, filed Oct. 23, 2006, the disclosures of which are hereby incorporated herein by reference in their entirety.

FIELD OF THE INVENTION

The present invention relates to semiconductor devices and, more particularly, to electromechanical non-volatile memory devices and related methods.

BACKGROUND OF THE INVENTION

Semiconductor memory devices capable of being used in, for example, portable electronic devices capable of processing large amounts of information are becoming more popular. These devices are typically required to have superior characteristics such as high speed, mass storage capacity, low power consumption, and the like.

These semiconductor memory devices typically have low power consumption as well as characteristics, such as the non-volatility of flash memory devices, the high operation speed of static random-access memory (SRAM) devices, the integration degree of dynamic random-access memory (DRAM) devices, and the like. These semiconductor memory devices may include, for example, ferroelectric random-access memory (FRAM) devices, magnetic random-access memory (MRAM) devices, phase-changeable random-access memory (PRAM) devices, and the like. FRAM devices, MRAM devices and PRAM devices typically operate with relatively low voltages.

Furthermore, these semiconductor memory devices may have superior data reading/writing characteristics compared to other memory devices, such as read-only memory (ROM), programmable read-only memory (PROM), erasable programmable read-only memory (EPROM), electrically erasable programmable read-only memory (EEPROM), DRAM, SRAM devices, and the like.

MRAM devices use magnetic characteristics. FRAM devices include non-volatile memory cells formed using ferromagnetic regions. The MRAM devices, the FRAM devices, and the like, are provided as magnetoresistance memory devices having anisotropic magnetoresistance, or giant magnetoresistance of ferromagnetic material. Thus, the memory cells may have characteristics, such as high resistance, low density, and the like.

Furthermore, the PRAM devices store data using structural phase-changes generated at a thin layer formed from an alloy including, for example, selenium (Se), tellurium (Te), and the like. The crystalline state and the amorphous state of the alloy are stably maintained in order to form a bi-stable switch. The PRAM devices may be used as a non-volatile memory cell. However, the operation speed of the PRAM device is typically slow. Furthermore, processes for manufacturing the PRAM devices are complex. The PRAM devices are typically not reliable.

Wires of nanometer scale are used in the semiconductor field. A memory device used as a non-volatile memory cell through electromechanical movement of wires has been proposed (hereinafter "electromechanical non-volatile memory device"). In the electromechanical non-volatile memory device, the wires move to make contact with an upper electrode pattern or a lower electrode pattern in response to a potential difference. The wires have a structure capable of maintaining the above contact state even when electric force has been removed.

The electromechanical non-volatile memory device may perform programming and erasing operations at a relatively high speed by using a low voltage. Furthermore, the cell structure of the electromechanical non-volatile memory device may be relatively simple so that it can be highly integrated.

An electromechanical non-volatile memory device is discussed in, for example, U.S. Pat. No. 6,924,538. As discussed therein, an upper portion and a lower portion of a wire are fixed by an insulating pattern. The wire may be damaged when the data is repetitively read, and thus defects may occur in the device. Furthermore, processes for manufacturing the electromechanical non-volatile memory device may be relatively complicated. It may also be difficult to form an electrode pattern between wires such that the electrode pattern does not make contact with the wires.

SUMMARY OF THE INVENTION

Some embodiments of the present invention provide electromechanical non-volatile memory devices including a semiconductor substrate having an upper surface including insulation characteristics. A first electrode pattern is provided on the semiconductor substrate. The first electrode pattern exposes portions of a surface of the semiconductor substrate therethrough. A conformal bit line is provided on the first electrode pattern and the exposed surface of semiconductor substrate. The bit line is spaced apart from a sidewall of the first electrode pattern and includes a conductive material having an elasticity generated by a voltage difference. An insulating layer pattern is provided on an upper surface of the bit line located on the semiconductor substrate. A second electrode pattern is spaced apart from the bit line and provided on the insulating layer pattern. The second electrode pattern faces the first electrode pattern.

In further embodiments of the present invention, a charge trap structure may be provided on the sidewalls and an upper surface of the first electrode pattern. The charge trap structure may be provided on the sidewalls of the first electrode pattern and may be spaced apart from the bit line. In certain embodiments, the charge trap structure may be a multilayer structure including a first dielectric layer, a charge trap layer on the first dielectric layer and a second dielectric layer on the charge trap layer. The charge trap layer may include silicon nitride.

In still further embodiments of the present invention, a charge trap layer pattern may be provided on sidewalls and a bottom face of the second electrode pattern. The charge trap layer pattern on the sidewalls of the second electrode pattern may be spaced apart from the bit line.

In some embodiments of the present invention, a portion of the second electrode pattern located higher than the bit line on an upper surface of the first electrode pattern has a width that is larger than a width of a portion of the second electrode pattern located lower than the bit line on the upper surface of the first electrode pattern.

In further embodiments of the present invention, the bit line may contact one of the first electrode pattern or the second electrode pattern according to the voltage difference between the bit line and the one of the first electrode pattern or the second electrode pattern.

In still further embodiments of the present invention, the first and second electrode patterns may extend in a first direction such that the first and second electrode patterns are alternately spaced apart from one another. The bit line may be spaced apart from sidewalls of the first and second electrode patterns and have a shape extending along an exposed surface of the semiconductor substrate and first electrode pattern.

In some embodiments of the present invention, an insulating interlayer is provided on upper surfaces of the first and second electrode patterns. In certain embodiments of the present invention, spaces between the first electrode pattern and the bit line and between the second electrode pattern and the bit line may be filled with nitrogen or vacuumized.

Although embodiments of the present invention are discussed above primarily with respect to devices, related methods are also provided.

DESCRIPTION OF THE EMBODIMENTS

Figure 1:
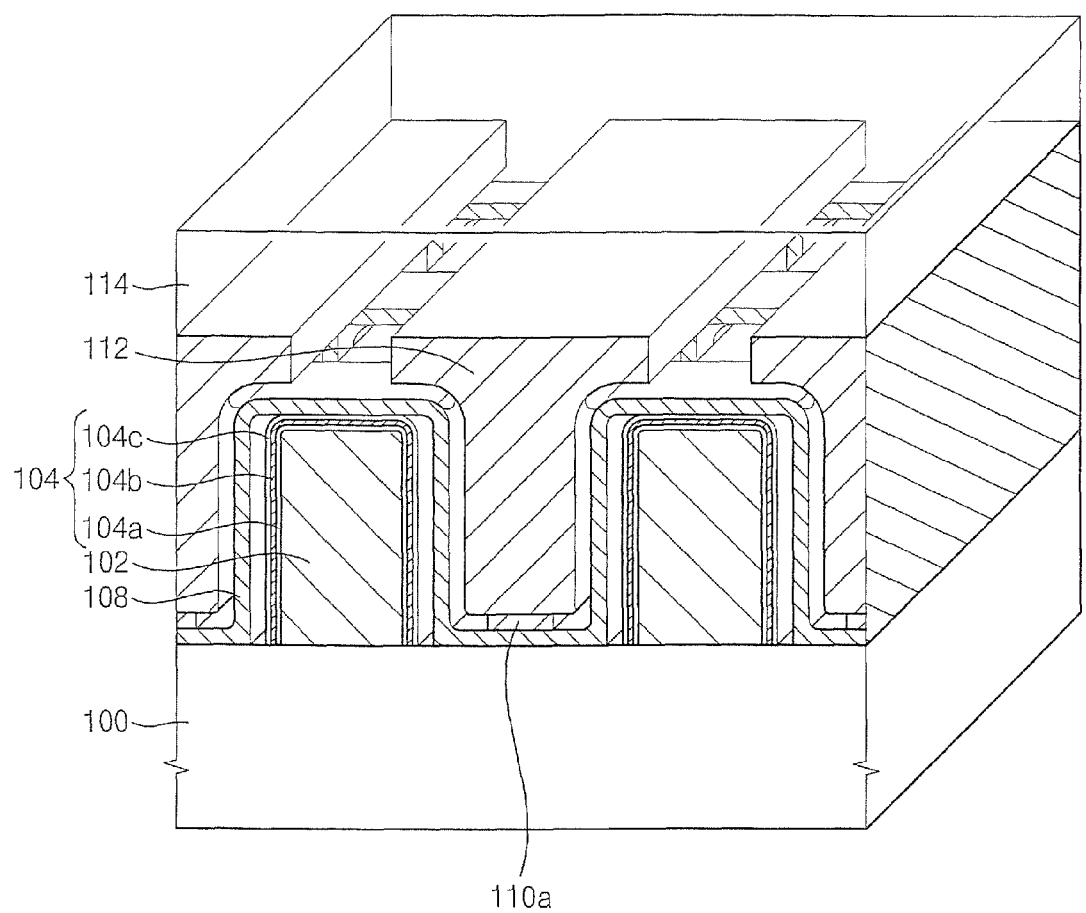
FIG. 1 is a perspective view illustrating an electromechanical non-volatile memory device in accordance with some embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third and the like. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-sectional illustrations that are schematic illustrations of idealized embodiments (and intermediate structures) of the present invention. As such, variations from the shapes of the illustrations as a result of, for example, manufacturing techniques and/or tolerances, are to be expected. Thus, embodiments of the present invention should not be construed as limited to the particular shapes of regions illustrated herein but are to include deviations in shapes that result from, for example, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the present invention will now be discussed with respect to FIGS. 1 through 23. Referring first to FIG. 1, a perspective view illustrating electromechanical non-volatile memory devices in accordance with some embodiments of the present invention will be discussed. As illustrated in FIG. 1, a supporting substrate 100 is provided. The supporting substrate 100 may have an upper surface having insulation characteristics. The supporting substrate 100 may include an insulating material. In some embodiments of the present invention, the supporting substrate 100 may be formed by depositing an insulating material on a flat board including, for example, a metal or a semiconductor material.

First electrode patterns 102 may be provided on the supporting substrate 100. The first electrode patterns 102 may have bar shapes extending along a first direction. The first electrode patterns 102 may be arranged parallel to each other. The first electrode patterns 102 may be spaced apart from each other. The first electrode pattern 102 may be used as a write word line for writing data in a cell. The first electrode patterns 102 may include, for example, a metal silicide, a metal, and the like, and any combination thereof.

In some embodiments of the present invention, an upper edge of the first electrode patterns 102 may have an angled shape. In these embodiments, an electric field may be concentrated on the upper edge. Thus, the upper edge of the first electrode pattern 102 may have a curvature to reduce the likelihood of concentration of the electric field.

A charge trap structure 104 may be provided on a sidewall and an upper face of the first electrode pattern 102. The charge trap structure may include a first dielectric layer 104a, a charge trap layer pattern 104b and a second dielectric layer pattern 104c that are subsequently formed. The charge trap layer pattern 104b may include silicon nitride including trap sites. The first dielectric layer pattern 104a and the second dielectric layer pattern 104c may include, for example, silicon oxide. In some embodiments of the present invention, at least one of the first dielectric layer pattern 104a and second dielectric layer pattern 104c may include, for example, a metal oxide having a relatively high dielectric constant.

Charges may be trapped inside the charge trap layer pattern 104a. The charges trapped inside the charge trap layer pattern 104a may generate an attractive force. Thus, a bit line 108 may be kept in contact with the first electrode pattern 102 after removing an electric force.

The bit line 108 may be separated from a surface of the charge trap structure 104 formed on a sidewall of the first electrode pattern 102. The bit line 108 may be provided along the charge trap structure 104 formed on an upper surface of the first electrode pattern 102 and an exposed surface of the supporting substrate 100. The bit line 108 may extend in a second direction substantially perpendicular to the first direction.

In other words, the bit line 108 may have a portion extending along an upper surface of the charge trap structure 104 formed on the upper surface of the first electrode pattern 102, a portion separated from the charge trap structure 104 formed on the sidewall of the first electrode pattern 102 and a portion extending along a surface of the supporting substrate 100.

The bit line 108 may include a conductive material having an elasticity that may be generated by a voltage difference. Examples of the conductive material that may be used to form the bit line 108 may include a metal, such as titanium, aluminum, and the like. The metals may be used alone or in combination without departing from the scope of the present invention.

An insulating layer pattern 110a may be provided on an upper surface of the bit line 108 on a surface of the supporting substrate 100. The insulating layer pattern 110a may include an insulating material such as silicon oxide, silicon nitride, undoped polysilicon, amorphous silicon, silicon germanium, germanium, and the like. In some embodiments of the present invention, the insulating materials may be used alone. The insulating layer pattern 110a may be a multilayer structure formed by depositing different insulating material at least twice.

A second electrode pattern 112 may be provided on the insulating layer pattern 110a such that the second electrode pattern 112 may be spaced apart from the bit line 108. The second electrode pattern 112 may face the first electrode pattern 102. In other words, the second electrode pattern 112 may be located between the first electrode patterns 102. The second electrode pattern 112 may extend in the first direction in which the first electrode patterns 102 extend. The second electrode pattern 112 may be used as a word line for reading data. The second electrode pattern 112 may include, for example, polysilicon doped with impurities, a metal silicide, a metal, and the like. These may be use alone or in combination without departing from the scope of the present invention.

A portion of the second electrode pattern 112, higher than an upper surface of the bit line 108, may have a width that is substantially larger than that of a portion of the second electrode pattern 112, lower than the upper surface of the bit line 108.

Spaces may be formed between the charge trap structure 104 and the bit line 108 and between the second electrode pattern 112 and the bit line 108. When a gas, such as oxygen gas or a water vapor gas, is inserted into the space, reliably of the device may suffer from reactants generated by the inserted gas. Therefore, in accordance with some embodiments of the present invention, the spaces between the charge trap structure 104 and bit line 108 and between the second electrode pattern 112 and bit line 108 may be filled with, for example, nitrogen. In some embodiments of the present invention, the spaces may be vacuumized to reduce an inflow of the reactive gases into the spaces.

An insulating interlayer 114 may be provided on the bit line 108 on the first electrode pattern 102 and the second electrode pattern 112. The insulating interlayer 114 may fill a gap between a portion of the bit line 108 extending perpendicularly to the supporting substrate 100 and the second electrode pattern 112. The insulating interlayer 114 may include, for example, silicon oxide. For example, the insulating interlayer 114 may include tetraethyl orthosilicate (TEOS), undoped silicate glass (USG), spin-on glass (SOG), high density plasma-chemical vapor deposition (HDP-CVD) oxide, and the like.

Figure 2:
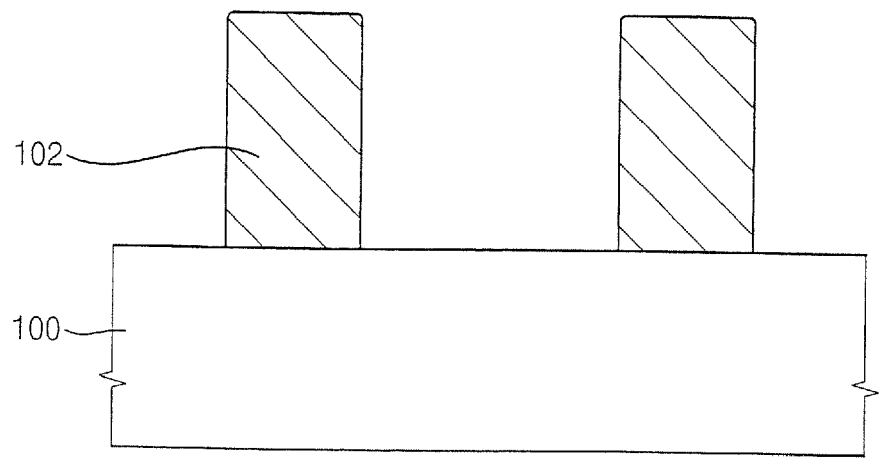
FIGS. 2 through 11 are cross-sections illustrating processing steps in the fabrication of the electromechanical non-volatile memory devices in FIG. 1 in accordance with some embodiments of the present invention.

Referring now to FIGS. 2 through 11, cross-sections illustrating processing steps in the fabrication of the electromechanical non-volatile memory devices of FIG. 1 in accordance with some embodiments of the present invention will be discussed. Referring first to FIG. 2, a supporting substrate 100 may be provided. An upper surface of the supporting substrate 100 may have insulation characteristics.

A first conductive layer (not shown) may be formed on the supporting substrate 100. Examples of material that may be used to form the first conductive layer may include metal, metal silicide, polysilicon doped with impurities. These may be used alone or combination without departing from the scope of the present invention.

The first conductive layer may be patterned by a photolithography process so that first electrode patterns 102 having substantial bar shapes extending in a first direction may be formed. The first electrode patterns 102 may be arranged parallel to one another, such that a gap may be formed between the first electrode patterns 102. A cleaning process may be performed to remove, for example, byproducts generated by the photolithography process. The first electrode patterns 102 obtained by the photolithography process and the cleaning process may have a curved upper edge portion.

Figure 3:
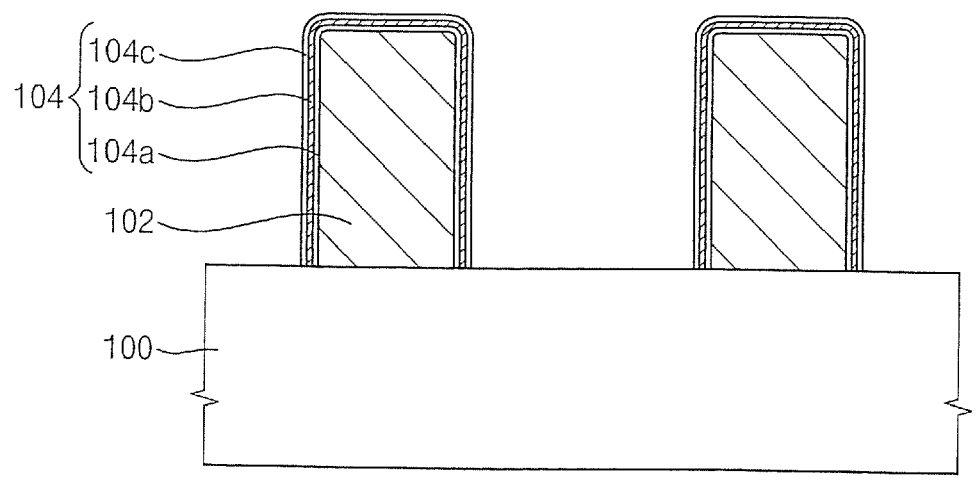

As illustrated in FIG. 3, a charge trap structure 104 may be formed on the supporting substrate 100 and the first electrode patterns 102. Particularly, a first dielectric layer, a charge trap layer and a second dielectric layer may be subsequently formed on the supporting substrate 100 and the first electrode patterns 102. The charge trap layer may be formed, for example, by depositing silicon nitride having charge trap sites. The first and second dielectric layers may be formed by, for example, depositing silicon oxide. In some embodiments of the present invention, at least one of the first and second dielectric layers may be formed by depositing metal oxide having a relatively high dielectric constant.

Mask patterns (not shown) provided on portions of the first dielectric layer, the charge trap layer and the second dielectric layer located on upper surfaces and sidewalls of the first electrode patterns 102 may be formed. The second dielectric layer, the charge trap layer and the first dielectric layer may be subsequently etched using the mask pattern as an etching mask. Thus, the charge trap structure 104 including a first dielectric layer pattern 104a, a charge trap layer pattern 104b and a second dielectric layer pattern 104c that are subsequently formed on the upper surfaces and the sidewalls of the first electrode patterns 102 may be formed.

Figure 4:
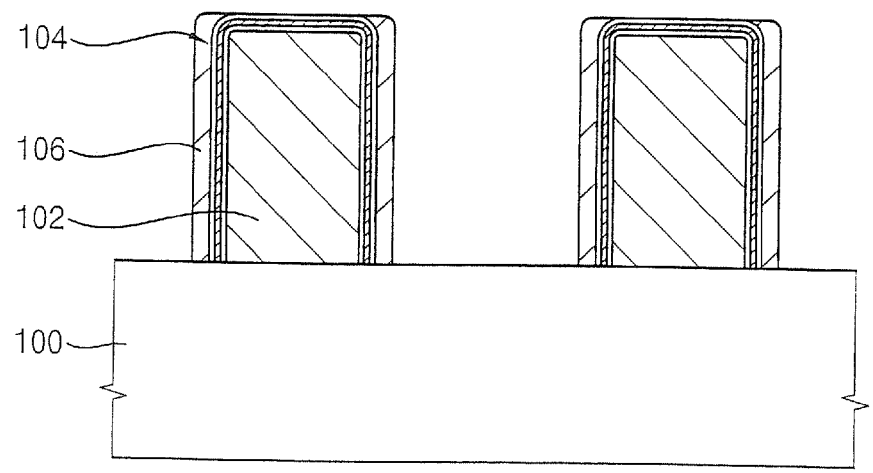

Referring to now to FIG. 4, a sacrificial layer (not shown) may be formed on the charge trap structure 104 and the supporting substrate 100. A thickness of the sacrificial layer may be substantially the same as a distance between a sidewall of the first electrode pattern 102 and a bit line (not shown) that is to be formed by subsequent processes. Thus, the distance between the sidewall of the first electrode pattern 102 and the bit line may be controlled by adjusting the thickness of the sacrificial layer.

The sacrificial layer may include a material having an etching selectivity with respect to the first electrode patterns 102, the bit line and a second electrode pattern that is formed by subsequent processes. Particularly, the first electrode patterns 102, the bit line and the second electrode patterns may be slightly etched while the sacrificial layer is isotropically etched. The sacrificial layer may include silicon, for example, oxide, silicon nitride, undoped amorphous polysilicon, silicon germanium, germanium, and the like. The material may be used alone or combination without departing from the scope of the present invention. However, the material used to form the sacrificial layer may vary in accordance with materials used to form the first electrode patterns 102, the bit line and the second electrode pattern. In some embodiments of the present invention, the materials may be used alone such that the sacrificial layer may be effectively removed by subsequent processes.

The sacrificial layer is anisotropically etched to form a sacrificial layer pattern 106 having a substantial spacer shape on the sidewall of the first electrode pattern 102.

Figure 5:
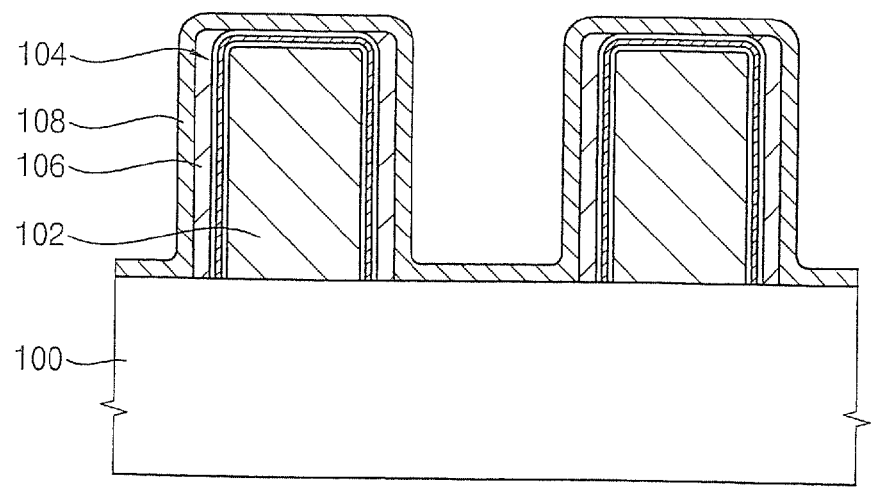

Referring now to FIG. 5, a second conductive layer (not shown) that is to be transformed into the bit line may be conformed to surfaces of the first electrode pattern 102, the sacrificial layer pattern 106 and the supporting substrate 100. The second conductive layer may be formed, for example, by depositing a conductive material having an elasticity generated by a voltage difference. Particularly, the second conductive layer may include a metal such as titanium, aluminum, and the like. These metals may be used alone or in combination without departing from the scope of the present invention.

The second conductive layer may be patterned using, for example, a photolithography process so that a bit line 108 extending in a second direction substantially perpendicular to the first direction may be formed.

Although not illustrated in the figures, in some embodiments of the present invention the sacrificial layer pattern 106 may be exposed from a region where the bit line 108 is not formed by the photolithography process.

Figure 6:
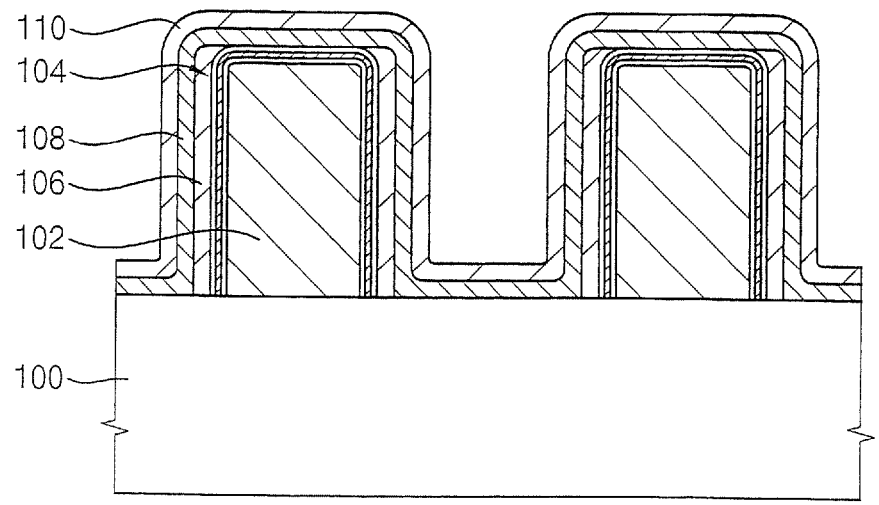

Referring now to FIG. 6, an insulating layer 110 may be formed on the bit line 108 and an exposed portion of the sacrificial layer pattern 106. A thickness of the insulating layer 110 may be substantially the same as a distance between the bit line 108 and a second electrode pattern that is to be formed by subsequent processes. Therefore, the distance between the bit line 108 and the second electrode pattern may be controlled by adjusting the thickness of the insulating layer 110.

The insulating layer 110 may include an insulating material having an etching selectivity with respect to the first electrode patterns 102, the bit line 108 and the second electrode pattern that is to be formed by subsequent processes. In other words, the first electrode patterns 102, the bit line 108 and the second electrode pattern may be hardly etched when the insulating layer 110 is etched. The insulating material may be, for example, silicon oxide, silicon nitride, undoped amorphous silicon, undoped silicon germanium, germanium, and the like. These insulating materials may be used alone so that the insulating layer 110 may be effectively removed by subsequent processes or in combination without departing from the scope of the present invention. However, the insulating material used to form the insulating layer 110 may vary in accordance with material used to form the first electrode patterns 102, the bit line 108 and the second electrode pattern.

In embodiments of the present invention where the insulating layer 110 and the sacrificial layer pattern 106 include the same material, the insulating layer 110 and the sacrificial layer pattern 106 may be removed by one etching process. Therefore, the insulating layer 110 and the sacrificial layer pattern 106 may include substantially the same material.

The sacrificial layer pattern 106, the bit line 108 and the insulating layer 110 may be conformed to the first electrode patterns 102 and the supporting substrate 100, such that the sacrificial layer pattern 106, the bit line 108 and the insulating layer 110 may not fill a gap between the first electrode patterns 102. Furthermore, a sufficient space in which the second electrode pattern is to be formed by subsequent processes may remain between the first electrode patterns 102 even though the insulating layer 110 is formed.

Figure 7:
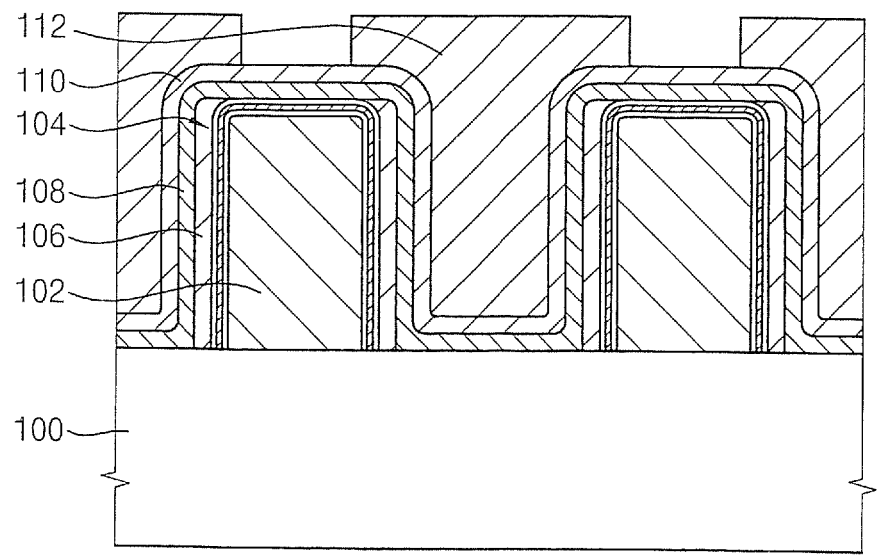

Referring now to FIG. 7, a third conductive layer (not shown) may be formed on the insulating layer 110 to fill the gap between the first electrode patterns 102. Thereafter, a chemical mechanical polishing (CMP) process may be performed to planarize an upper surface of the third conductive layer. A photolithography process may be performed on the third conductive layer to form the second electrode pattern 112.

The second electrode pattern 112 may be formed such that the second electrode pattern 112 may be located higher than the bit line 108 formed on the upper surface of the first electrode pattern 102. Further, a portion of the second electrode pattern 112 located higher than the bit line 108 formed on the upper surface of the first electrode pattern 102 may be formed to have a width that is wider than a width of a portion of the second electrode pattern 112 located lower than that of the bit line 108 formed on the upper surface of the first electrode pattern 102. Therefore, the second electrode pattern 112 may have a substantial "T" shape to at least partially cover an end of the bit line 108 formed on the upper surface of the first electrode pattern 102.

Figure 8:
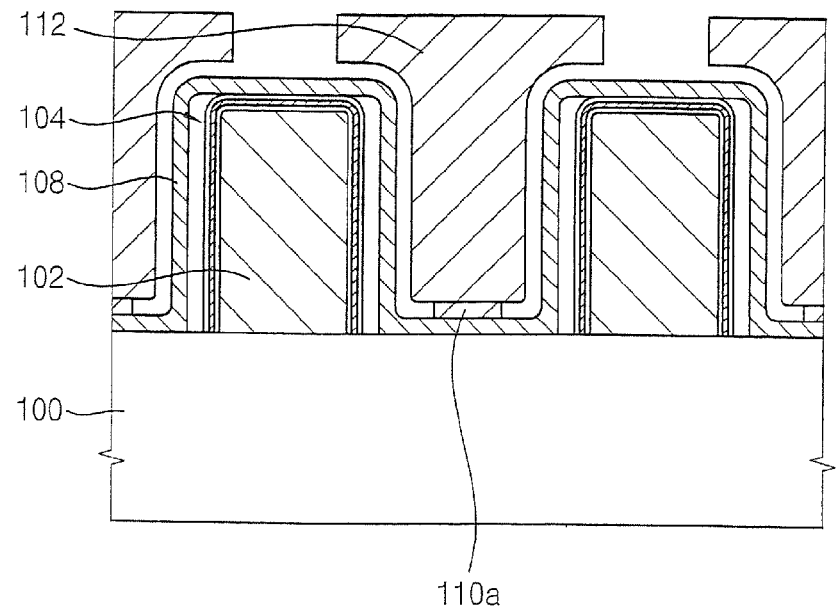

Referring now to FIG. 8, a portion of the insulating layer 110 and the sacrificial layer pattern 106 may be etched to form spaces between the first electrode pattern 102 and the bit line 108 and between the second electrode pattern 112 and the bit line 108. The etching process may be, for example, an isotropic etching process. For example, the etching process may be a wet etching process.

In embodiments of the present invention where the insulating layer 110 and the sacrificial layer pattern 106 include different materials, the insulating layer 110 and the sacrificial layer pattern 106 may be subsequently removed by, for example, an isotropic etching processes.

When the insulating layer 110 is etched, only the portion of the insulating layer 110 formed on the upper surface and sidewalls of the first electrode pattern 102 may be etched. Therefore, an insulating layer pattern 110a may be formed on the bit line 108 located on the surface of the supporting substrate 100 after the etching process is performed.

Figure 9:
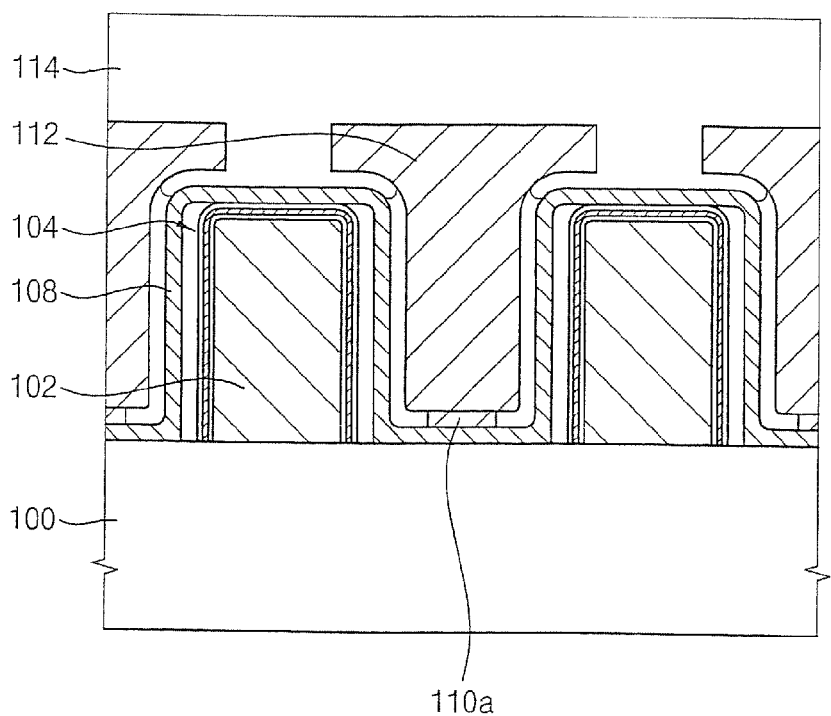

Referring now to FIG. 9, the spaces between the first electrode pattern 102 and the bit line 108 and between the second electrode pattern 112 and the bit line 108 may be filled with nitrogen. In some embodiments of the present invention, the spaces between the first electrode pattern 102 and the bit line 108 and between the second electrode pattern 112 and the bit line 108 may be vacuumized.

An insulating interlayer 114 may be formed on the bit line 108 located on the upper surface of the first electrode patterns 102 and the second electrode pattern 112. The insulating interlayer 114 may be formed by, for example, depositing silicon oxide. In these embodiments of the present invention, the insulating interlayer 114 may be formed by depositing, for example, tetraethyl orthosilicate (TEOS), undoped silicate glass (USG), spin on glass (SOG), high density plasma-chemical vapor deposition (HDP-CVD) oxide, and the like.

An upper portion of the second electrode pattern 112 has a relatively large width. Thus, the insulating interlayer 114 may not fill a space between the second electrode pattern and a portion of the bit line 108 extending perpendicularly to the supporting substrate 100.

Thus, the space between the second electrode pattern 112 and the portion of the bit line 108 extending perpendicularly to the supporting substrate 100 may be maintained even though the insulating interlayer 114 is formed. In some embodiments of the present invention, the process for forming the insulating interlayer 114 and the process for filling the space with the nitrogen or vacuumizing the space may be performed in-situ.

Figure 10:
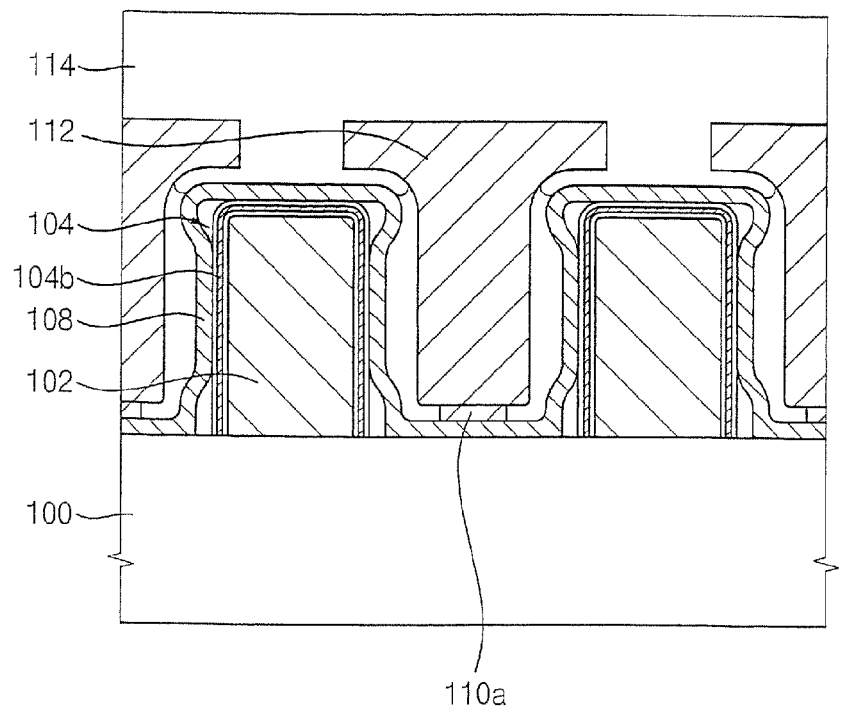

Referring now to FIG. 10, a voltage is applied to the first electrode pattern 102 and the bit line 108 such that a voltage difference may be generated between the first electrode pattern 102 and the bit line 108. Thus, the bit line 108 may make contact with the charge trap structure 104 located on the first electrode pattern 102. Charges may be injected into the charge trap layer pattern 104b included in the charge trap structure 104 by applying a voltage to the bit line 108.

Figure 11:
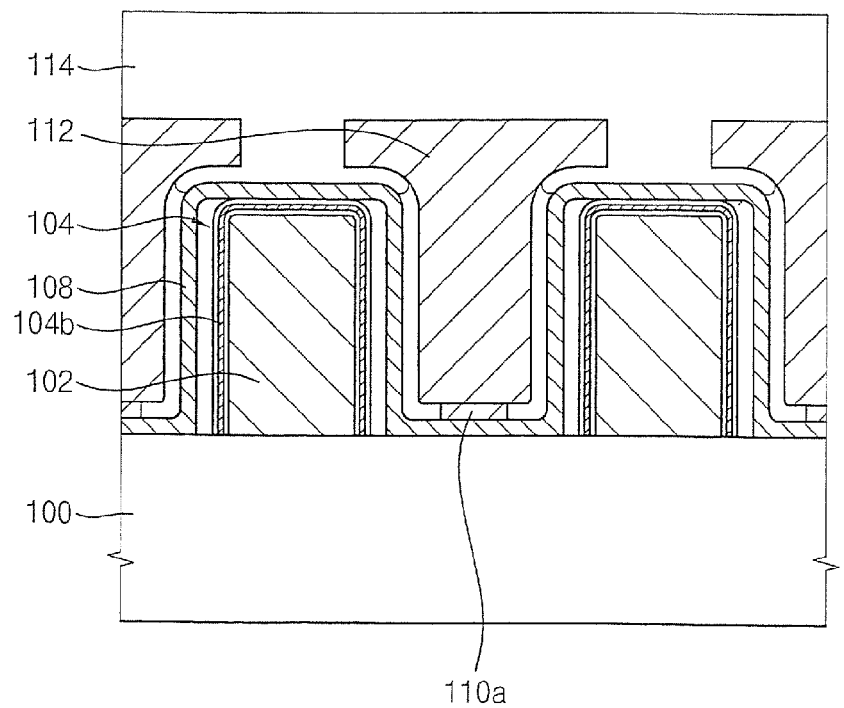

Referring now to FIG. 11, the voltage difference between the first electrode pattern 102 and the bit line 108 may be adjusted so that the first electrode pattern 102 and the bit line 108 may be separated from each other after the charges are injected sufficiently into the charge trap layer pattern 104b.

Electromechanical non-volatile memory devices including the charge trap structure having the charges on surfaces of the first electrode pattern in accordance with some embodiments of the present invention may be manufactured by the process described above.

Figure 12:
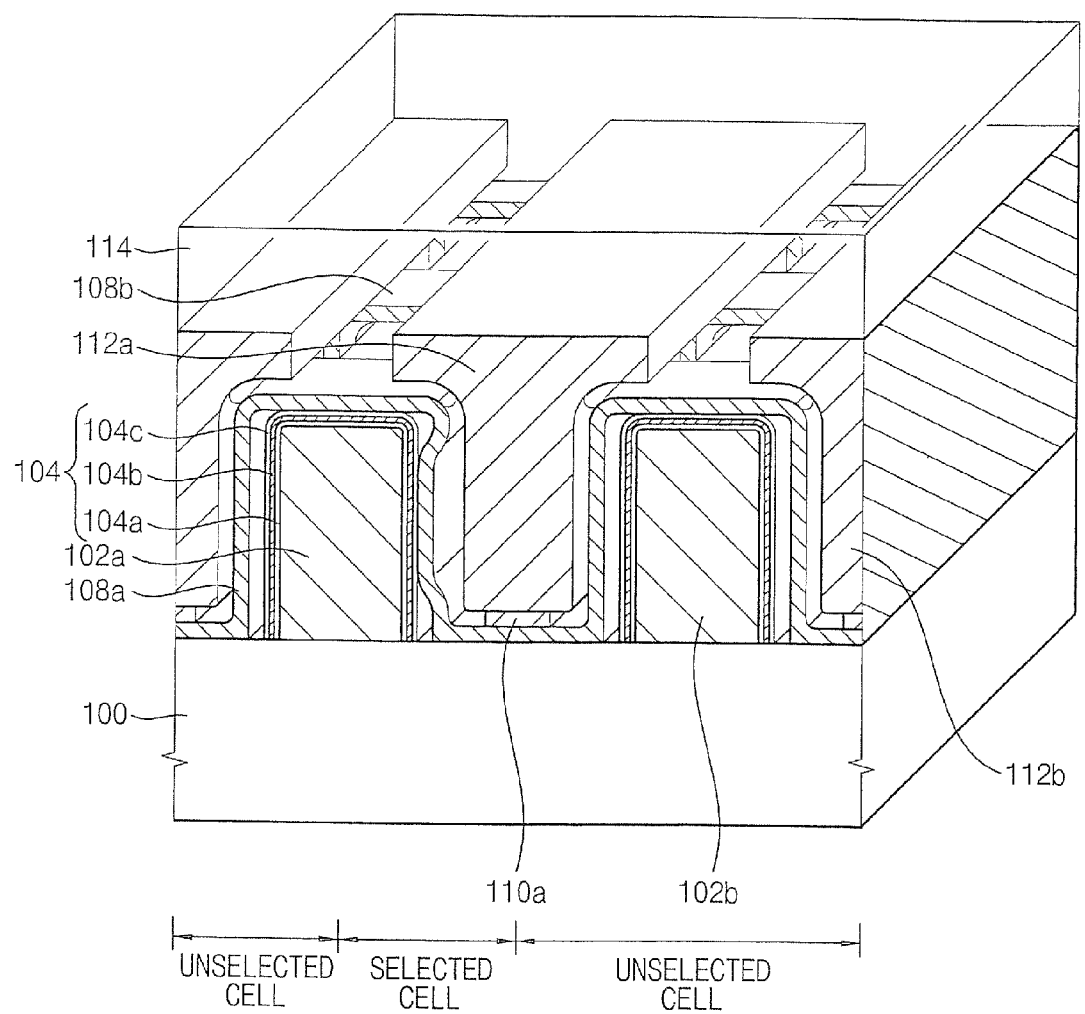
FIGS. 12 and 13 illustrate a data storage status of the electromechanical non-volatile memory devices in FIG. 1.
Figure 13:
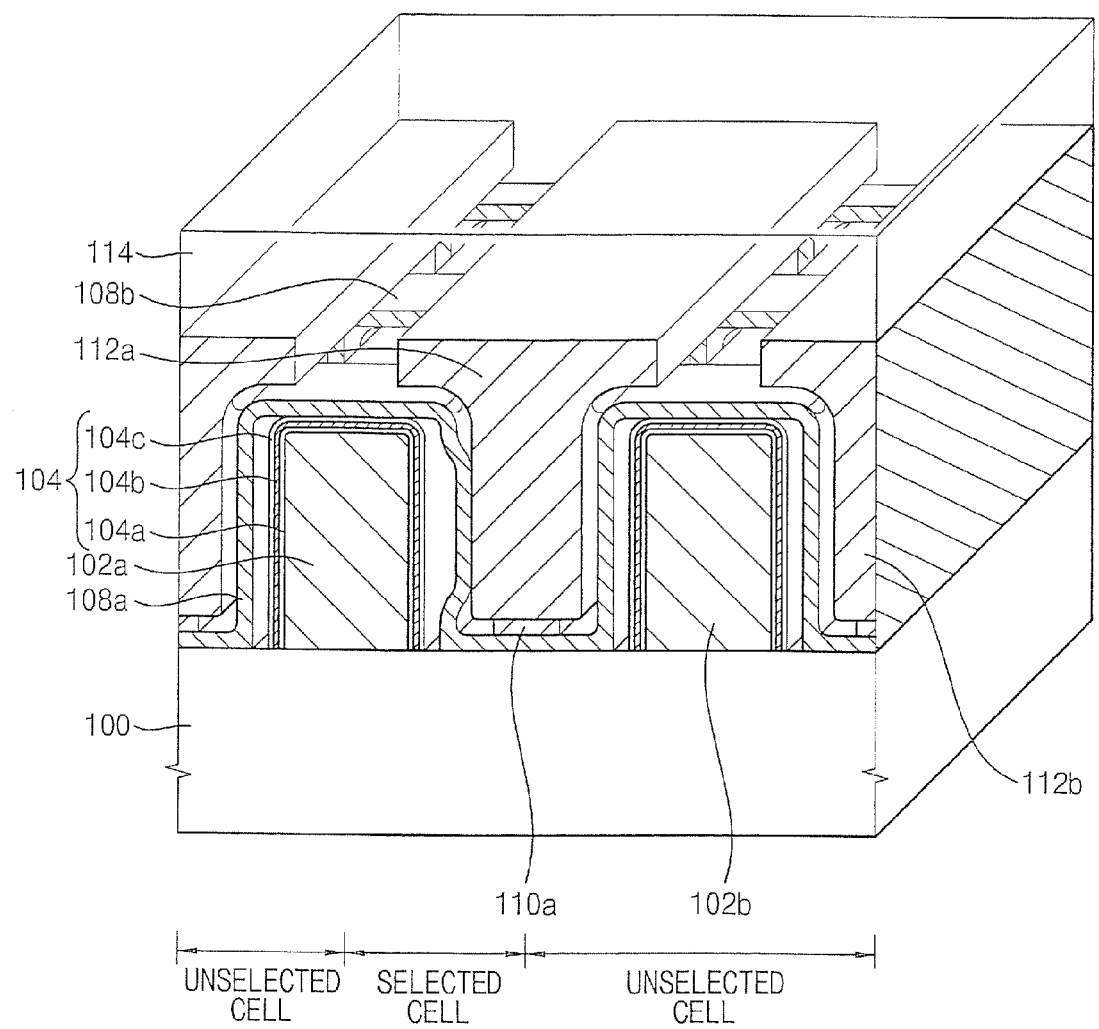

Operations of the electromechanical non-volatile memory devices illustrated in FIG. 1 will now be discussed with respect to FIGS. 12 and 13. FIGS. 12 and 13 illustrate a data storage status of the electromechanical non-volatile memory device of FIG. 1 in accordance with some embodiments of the present invention. As illustrated in FIG. 12, in some embodiments of the present invention a case where the bit line 108 makes contact with the first electrode pattern 102 is defined as a state "0". In addition, cases except for the state "0" may be defined as a state "1".

As illustrated in FIG. 12, the bit line 108 may not make contact with the first electrode pattern 102 or the second electrode pattern 112 in state "1". As illustrated in FIG. 13, the bit line 108 may make contact with the second electrode pattern 112 in the state "1".

A voltage difference between the bit line 108 and the first electrode pattern 102 may be adjusted so that a position of the bit line 108 may vary. Thus, data "1" or "0" may be written in the non-volatile memory device.

For example, a first voltage may be applied to the bit line 108 and the first electrode pattern 102 such that the bit line 108 may make contact with the first electrode pattern 102. Thus, the data "0" may be written. Alternately, a second voltage may be applied to the bit line 108 and the first electrode pattern 102 such that the bit line 108 and the first electrode pattern 102 may be separated from each other. Thus, the data "1" may be written.

A contact state of the bit line 108 may not be changed even though a voltage is not applied. This is because the charges stored in the charge trap structure 104 generate an attractive force. As a result, the written data may not be changed.

In the electromechanical non-volatile memory devices illustrated in FIG. 1, application of a predetermined voltage may be required not only to a selected cell but also to an unselected cell to reduce the likelihood that undesired data will be written in the unselected cell.

Methods of writing data "0" and data "1" in a selected cell will now be discussed. First, operations for writing data "0" will be discussed. ½ Vpull-in may be applied to a selected bit line 108a. ½ Vpull-out may be applied to a selected first electrode pattern 102a. In addition, states of an unselected bit line 108b, an unselected first electrode pattern 102b, a selected second electrode pattern 112a and an unselected second electrode pattern 112b may become ground states. In these embodiments, the Vpull-in may be a voltage difference between a bit line and a first electrode pattern and the Vpull-in may be required to change a data "1" state to a data "0" state. The Vpull-out may be a voltage difference between the bit line and the first electrode pattern and the Vpull-out may be required to change the data "0" state to the data "1" state.

As discussed above, ½ Vpull-in and ½ Vpull-out are applied to the selected bit line 108a and the selected first electrode pattern 102a, respectively, so that the bit line 108a of the selected cell may make contact with the first electrode patterns 102a. Thus, the data "0" may be written. In addition, data may not be written in cells sharing the bit line 108a of the selected cell and cells sharing the first electrode pattern 102a of the selected cell.

Now, operations for writing the data "1" will be discussed. ½ Vpull-out may be applied to a selected bit line 108a. ½ Vpull-in may be applied to a selected first electrode pattern 102a. In addition, states of an unselected bit line 108b, an unselected first electrode pattern 102b, a selected second electrode pattern 112a and an unselected second electrode pattern 112b may become ground states.

As discussed above, ½ Vpull-out and ½ Vpull-in may be applied to the selected bit line 108a and the selected first electrode pattern 102a, respectively, so that the bit line 108a of the selected cell may be separated from the first electrode patterns 102a. Thus, data "1" may be written. In addition, data may not be written to cells sharing the bit line 108a of the selected cell and cells sharing the first electrode pattern 102a of the selected cell.

To read the data written in the non-volatile memory device, a reading voltage may be applied to the bit line 108 and the second electrode pattern 112. In particular, states of the selected bit line 108a, the unselected bit line 108b, the selected first electrode pattern 102a, the unselected first electrode pattern 102a, and the unselected second electrode pattern 112b may become a ground state. The reading voltage may be applied to the selected second electrode pattern 112a.

When the data "0" is written in the non-volatile memory device, the selected bit line 108a may make contact with the first electrode pattern 102a. Thus, the bit line 108a may not move toward the selected second electrode pattern 112a even though the reading voltage is applied. Therefore, the bit line 108a and the second electrode pattern 112a may be electrically separated so that currents may not flow between the bit line 108a and the second electrode pattern 112a.

However, when the data "1" is written in the non-volatile memory device, the selected bit line 108a may make contact with the selected second electrode pattern 112a or the bit line 108a may not make contact with the second electrode pattern 112a and the first electrode pattern 102a.

In these embodiments of the present invention, when the reading voltage is applied to the bit line 108a and the second electrode pattern 112a, the bit line 108a may make contact with the second electrode pattern 112a due to a voltage difference. Therefore, as illustrated in FIG. 13, the bit line 108a and the second electrode pattern 112a may be electrically connected so that the currents may flow between the bit line 108a and the second electrode pattern 112a.

As discussed above, the currents flowing between the bit line 108a and the second electrode pattern 112a may become different according to stored data. Therefore, the data stored in the non-volatile memory device may be distinguished by sensing the currents flowing between the bit line 108a and the second electrode pattern 112a.

During operations of the memory device discussed above, the first electrode pattern 102 may be used only for writing data. The second electrode pattern 112 may be used only for reading the data. Thus, the data may be written and read more precisely by respectively using the first and the second electrode patterns 102 and 112 for different purposes.

Operations of the memory device discussed above are provided herein for exemplary purposes only. Thus, many apparent variations of operations of the memory device are possible without departing from the scope of the present invention. Operations for reading and/or writing the data may vary to effectively distinguish the difference in a movement and a contact of the bit line.

Figure 14:
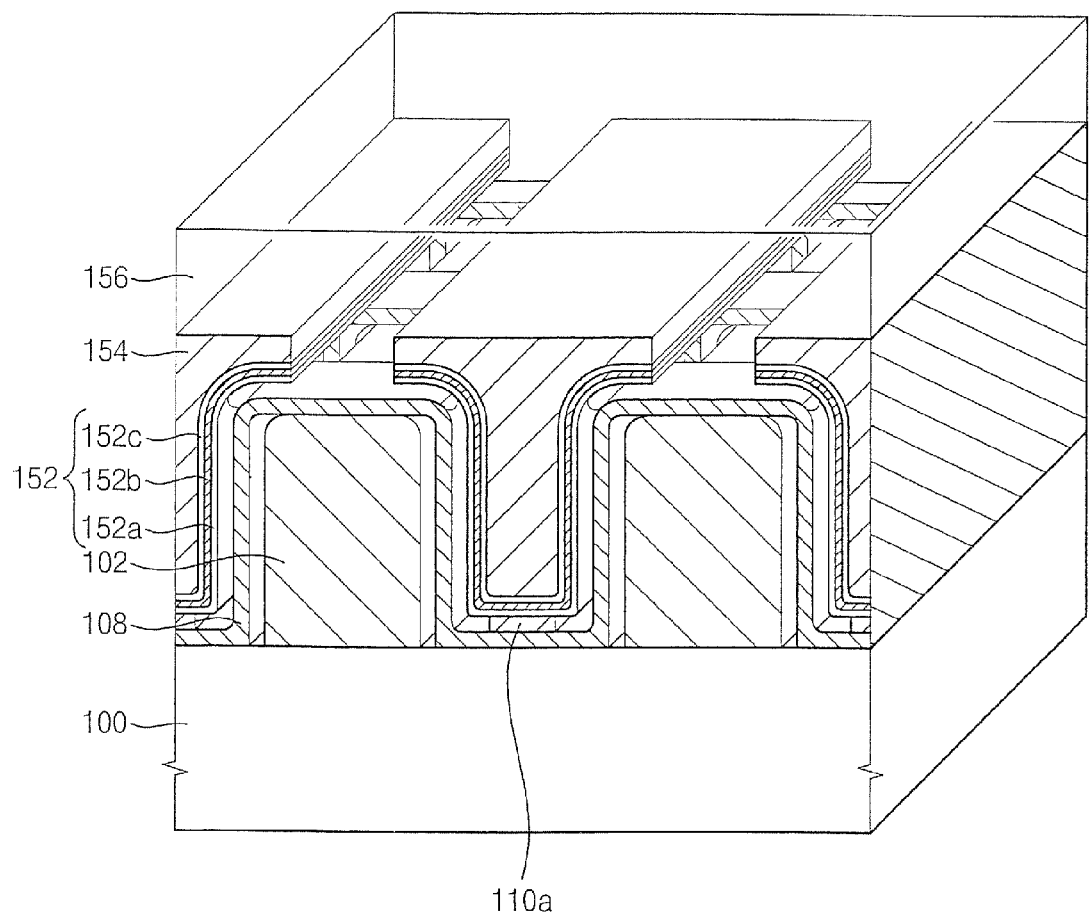
FIG. 14 is a perspective view illustrating electromechanical non-volatile memory devices in accordance with some embodiments of the present invention.

Referring now to FIG. 14, a perspective view illustrating electromechanical non-volatile memory devices in accordance with some embodiments of the present invention will be discussed. The electromechanical non-volatile memory devices illustrated in FIG. 14 may be substantially the same as the device in FIG. 1 except for a charge trap structure provided on a surface of the second electrode pattern. Therefore, the same reference numerals will be used in FIG. 14 in order to designate the like elements also illustrated in FIG. 1.

As illustrated in FIG. 14, a supporting substrate 100 may be provided. The supporting substrate 100 may include an upper surface having insulation characteristics. First electrode patterns 102 may be provided on the supporting substrate 100. The first electrode patterns 102 may have bar shapes extending in a first direction. In addition, the first electrode patterns 102 may be parallel to each other. The first electrode patterns 102 may correspond to word lines used to read data.

A bit line spaced apart from a sidewall of the first electrode pattern 102 may be provided along an upper surface of the first electrode pattern 102 and an exposed surface of the supporting substrate 100. The bit line 108 may extend along the second direction perpendicular to the first direction. In other words, the bit line 108 may have a portion extending along the upper surface of the first electrode pattern 102, a portion spaced apart from the sidewall of the first electrode patterns 102 and a portion extending along the surface of the supporting substrate 100.

The bit line 108 may include a conductive material having an elasticity generated by a voltage difference. Examples of the conductive material that may be used to form the bit line 108 may be a metal such as titanium, aluminum, and the like. These metals may be used alone or in combination without departing from the scope of the present invention.

An insulating layer pattern 110a may be provided on an upper surface of the bit line 108 located on the surface of the supporting substrate 100. The insulating layer pattern 110a may include an insulating material, such as silicon oxide, silicon nitride, undoped polysilicon, amorphous silicon, silicon germanium, germanium and the like. These may be used alone. In some embodiments of the present invention, the insulating layer pattern 110a may be a multilayer structure formed by depositing the different insulating materials at least twice.

A charge trap structure 152 may be provided on the insulating layer pattern 110a. The charge trap structure 152 may be spaced apart from the bit line 108. The charge trap structure 152 may face the sidewalls and portions of upper surfaces of the first electrode patterns 102. An upper portion of the charge trap structure 152 may be curved to face a portion of an upper surface of the first electrode pattern 102. The charge trap structure 152 may include a first dielectric layer pattern 152a, a charge trap layer pattern 152b and a second dielectric layer pattern that are subsequently formed.

A second electrode pattern 154 may be provided on the charge trap structure 152. The second electrode pattern 152 may fill an inside of the charge trap structure 152. Further, a portion of the second electrode pattern 154 located higher than the bit line 108 located on the upper surface of the first electrode pattern 102 may have a width larger than a portion lower than the bit line 108 located on the upper surface of the first electrode pattern 102. The second electrode pattern 154 may correspond to a word line used to write data.

Spaces between the charge trap structure 152 and the bit line 108 and between the first electrode pattern 102 and the bit line 108 may be filled with nitrogen. In some embodiments of the present invention, the spaces may be vacuumized.

An insulating interlayer 156 may be provided on the bit line 108 located on the first electrode pattern 102 and an upper surface of the second electrode pattern 154. The insulating interlayer 156 may partially fill the space between a portion of the bit line 108 extending perpendicularly to the supporting substrate 100 and the second electrode pattern 154. The insulating interlayer 156 may include silicon oxide. For example, the insulating interlayer 156 may include tetraethyl orthosilicate (TEOS), undoped silicate glass (USG), spin on glass (SOG), high density plasma-chemical vapor deposition (HDP-CVD) oxide, and the like.

Figure 15:
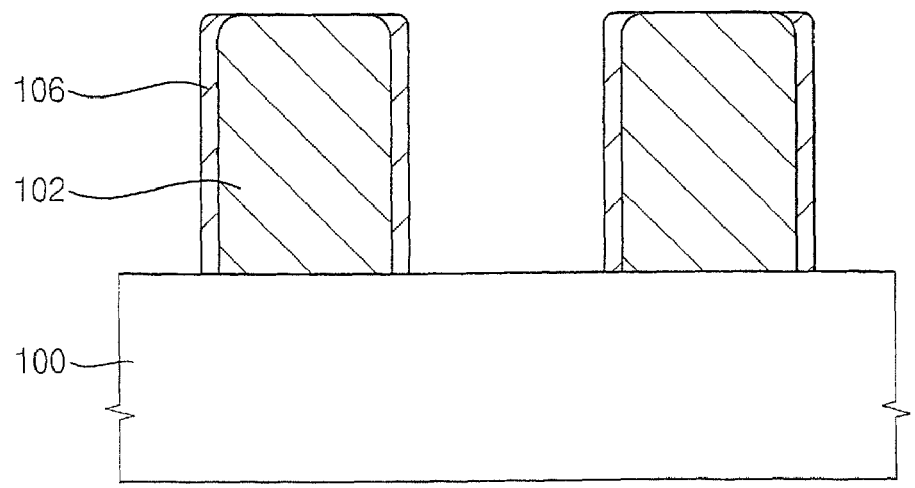
FIGS. 15 through 22 are cross-sectional views illustrating processing steps in the fabrication of the electromechanical non-volatile memory devices in FIG. 14 in accordance with some embodiments of the present invention.

Referring now to FIGS. 15 through 22, cross-sections illustrating processing steps in the fabrication of the electromechanical non-volatile memory devices in FIG. 14 will be discussed. As illustrated in FIG. 15, a supporting substrate 100 may be provided. The supporting substrate 100 may include an upper surface having an insulating characteristic.

A first conductive layer (not shown) may be formed on the supporting substrate 100. Examples of a material that may be used to form the first conductive layer may be polysilicon doped with impurities, a metal silicide, a metal, and the like. These may be used alone or combination without departing from the scope of the present invention.

The first conductive layer may be patterned by a photolithography process so that first electrode patterns 102 having bar shapes extending in a first direction may be formed. The first direction may be perpendicular to an upper surface of the supporting substrate 100. The first electrode patterns 102 may be parallel to each other by a predetermined distance.

A sacrificial layer (not shown) may be formed on surfaces of the first electrode patterns 102 and the supporting substrate 100. A thickness of the sacrificial layer may be substantially the same as a distance between the first electrode pattern and bit lines that is formed in subsequent processes. Therefore, the distance between the first electrode pattern 102 and the bit line may be controlled by adjusting the thickness of the sacrificial layer.

The sacrificial layer may include a material having an etching selectivity with respect to the first electrode pattern, the bit line and a second electrode pattern that is formed in subsequent processes. In other words, the first electrode pattern, the bit line and the second electrode pattern may be hardly etched when the sacrificial layer is isotropically etched. A sacrificial layer pattern 106 having a spacer shape may be formed on sidewalls of the first electrode patterns 102 by, for example, anisotropic etching the sacrificial layer.

Figure 16:
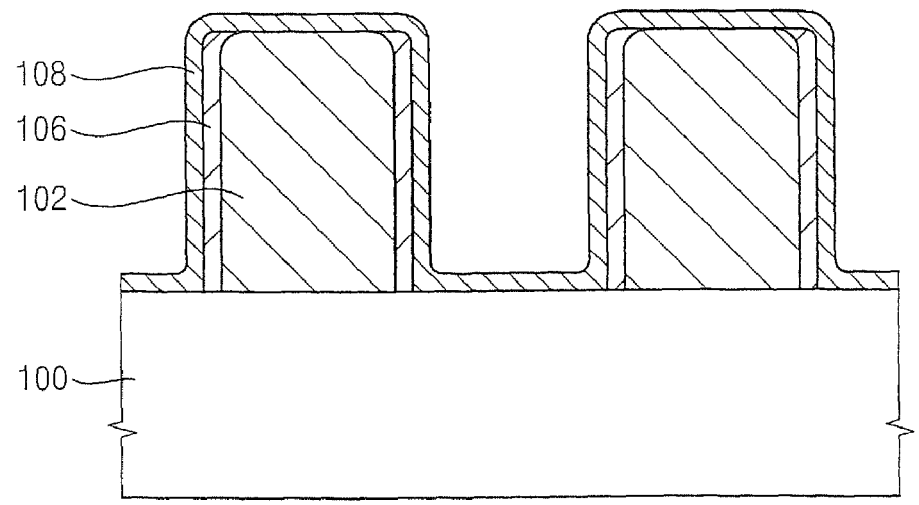

Referring now to FIG. 16, a second conductive layer (not shown) that is to be transformed into the bit line may be conformed to an upper surface of the first electrode pattern 102, the sacrificial layer pattern 106 and a surface of the supporting substrate 100. The second conductive layer may be formed by, for example, depositing a conductive material having an elasticity that may be generated by a voltage difference. The second conductive layer may include a metal such as titanium, aluminum, and the like. These metals may be used alone or in combination without departing from the scope of the present invention.

The second conductive layer may be patterned using, for example, a photolithography process so that a bit line 108 extending in a second direction substantially perpendicular to the first direction may be formed.

Figure 17:
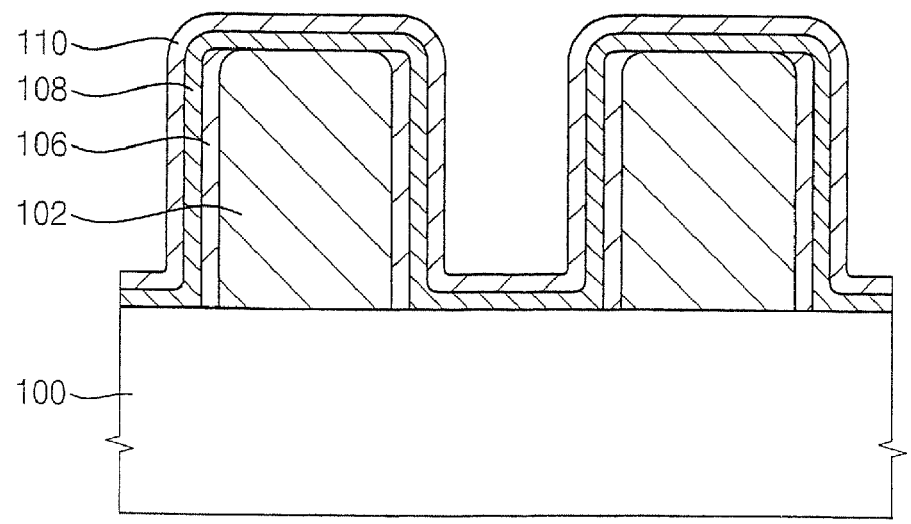

Referring now to FIG. 17, an insulating layer 110 may be formed on the bit line 108 and an exposed portion of the sacrificial layer pattern 106. A thickness of the insulating layer 110 may be substantially the same as a distance between the bit line 108 and a second electrode pattern that is to be formed by subsequent processes. Therefore, the distance between the bit line 108 and the second electrode pattern may be controlled by adjusting the thickness of the insulating layer 110.

The insulating layer 110 may include an insulating material having an etching selectivity with respect to the first electrode patterns 102, the bit line 108 and the second electrode pattern that is formed in subsequent processes. In other words, the first electrode patterns 102, the bit lines 108 and the second electrode pattern may be slightly etched when the insulating layer 110 is etched.

Figure 18:
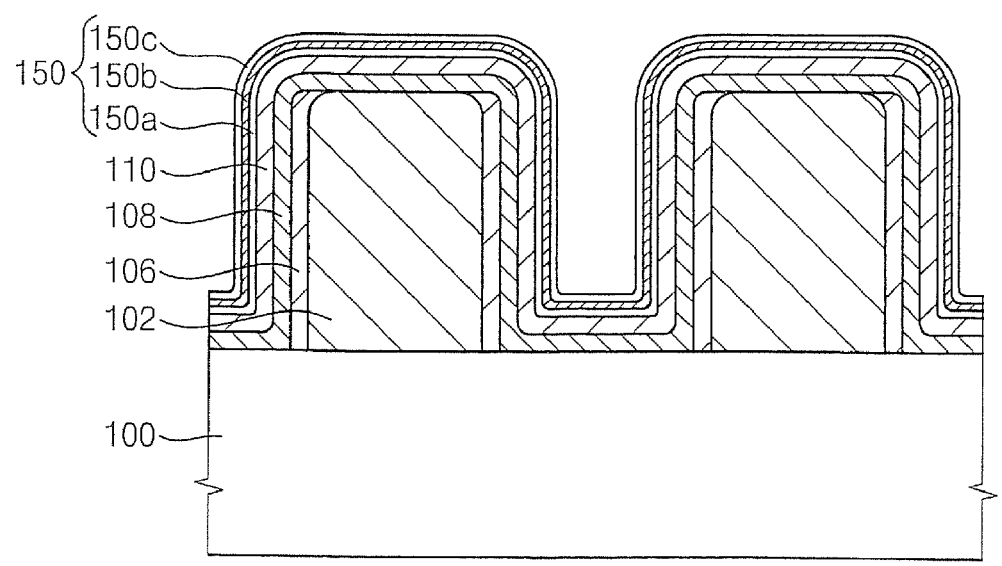

Referring now to FIG. 18, a preliminary charge trap structure 150 may be formed on the insulating layer 110. The preliminary charge trap structure 150 may include a first dielectric layer 150a, a charge trap layer 150b and a second dielectric layer 150c that are subsequently formed.

The sacrificial layer pattern 106, the bit line 108, the insulating layer 110 and the preliminary charge trap structure 150 may partially fill a space between the first electrode patterns 102. The sacrificial layer pattern 106, the bit line 108, the insulating layer 110 and the preliminary charge trap structure 150 may be conformed to the first electrode patterns 102 and the supporting substrate 100. In addition, a sufficient space in which the second electrode pattern is to be formed by subsequent processes may remain between the first electrode patterns 102 after the preliminary charge trap structure 150 is formed.

Figure 19:
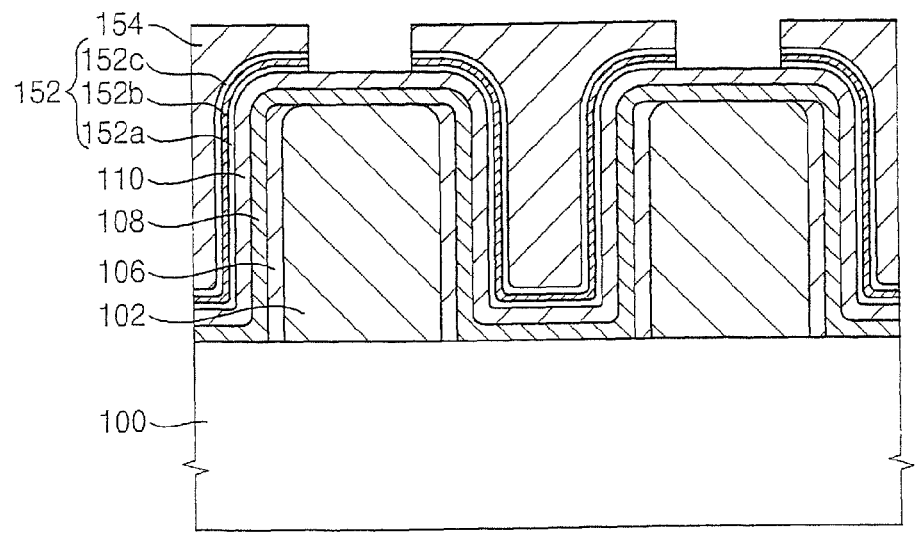

Referring now to FIG. 19, a third conductive layer (not shown) covering the insulating layer 110 is formed such that the third conductive layer fills up the space between the first electrode patterns 102. A chemical mechanical polishing process may be performed to polish an upper surface of the third conductive layer. The third conductive layer is patterned using, for example, a photolithography process so that the second electrode pattern 154 may be formed.

The second electrode pattern 154 may be formed such that the second electrode pattern 154 may be located higher than the bit line 108 located on an upper surface of the first electrode pattern 102. In addition, a portion of the second electrode pattern 154 located higher than the bit line 108 located on the upper surface of the first electrode pattern 102 may be formed to have a width larger than that of a portion of the second electrode pattern 154 located lower than the bit line 108 located on the upper surface of the first electrode pattern 102. Therefore, the second electrode pattern 154 may have a substantial "T" shape to partially cover an end of the bit line 108 located on the upper surface of the first electrode pattern 102.

A preliminary charge trap structure (not shown) exposed by the second electrode pattern 154 may be etched to form a charge trap structure 152. The insulating layer 110 may be partially exposed by a formation of the charge trap structure 152.

Figure 20:
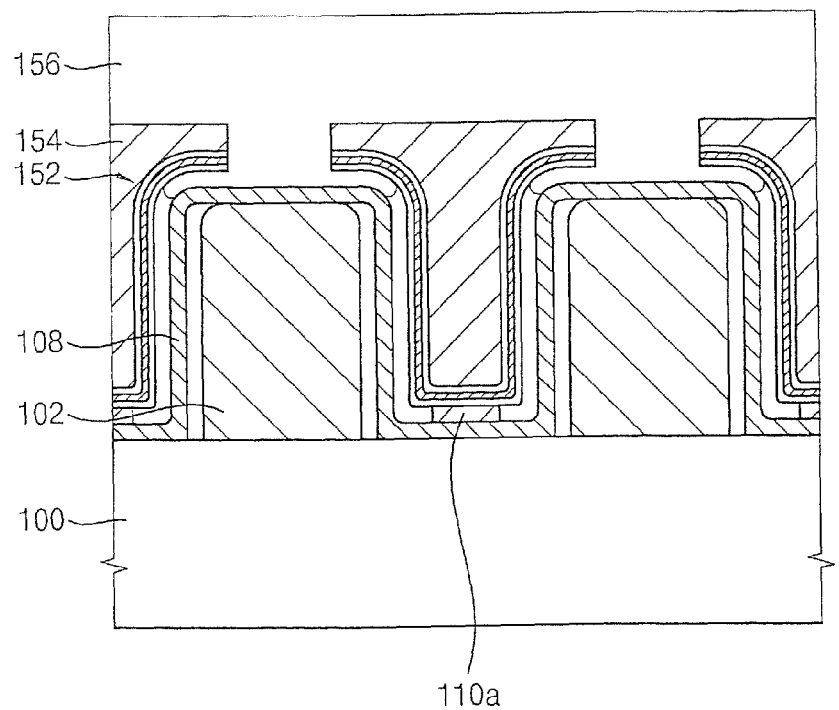

Referring now to FIG. 20, substantially the same process as discussed above with respect to FIGS. 8 and 9 may be performed. In particular, a portion of the insulating layer 110 and the sacrificial layer pattern (not shown) may be etched so that spaces may be formed between the first electrode pattern 102 and the bit line 108 and between the second electrode pattern 154 and the bit line 108.

The spaces between the first electrode pattern 102 and the bit line 108 and between the second electrode pattern 154 and the bit line 108 may be filled with nitrogen. In some embodiments of the present invention, the spaces between the first electrode pattern 102 and the bit line 108 and between the second electrode pattern 154 and the bit line 108 may be vacuumized. An insulating interlayer 156 may be formed on the bit line 108 located on the upper surface of the first electrode patterns 102 and the second electrode pattern 154.

Figure 21:
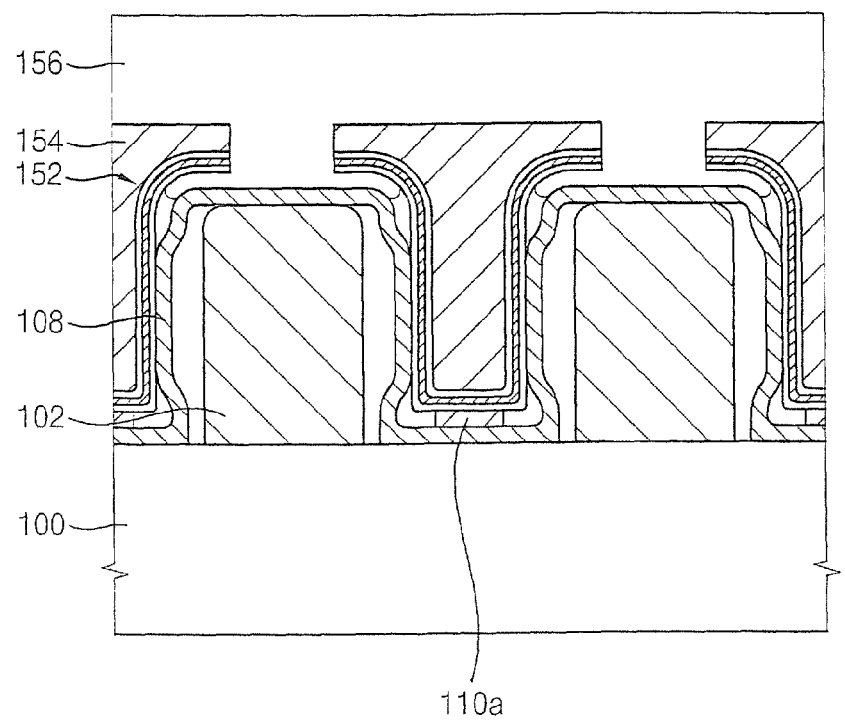

Referring now to FIG. 21, charges may be injected into a charge trap layer pattern included in the charge trap structure 152. A voltage may be applied to the second electrode pattern 154 and the bit line 108 so that a voltage difference may be generated between the second electrode pattern 154 and the bit line 108. The bit line 108 may make contact with the charge trap structure 152 formed on the second electrode pattern 154. The charges may be injected into the charge trap layer pattern included in the charge trap structure 152 by applying the voltage to the bit line 108.

Figure 22:
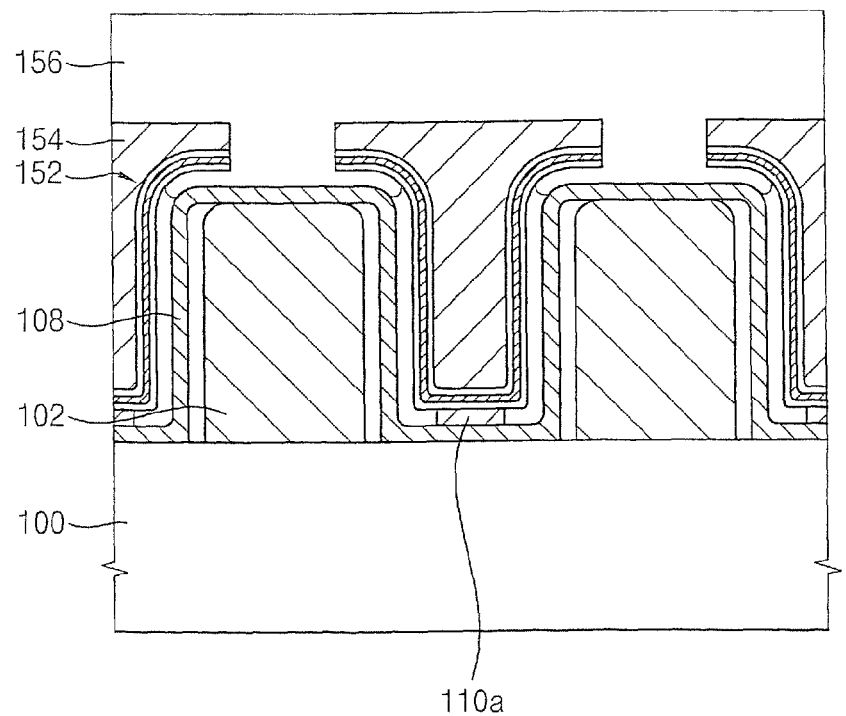

Referring now to FIG. 22, the voltage difference applied between the second electrode pattern 154 and the bit line 108 may be adjusted such that the second electrode pattern 154 and the bit line 108 may be separated from each other after the charges are injected sufficiently into the charge trap layer.

Figure 23:
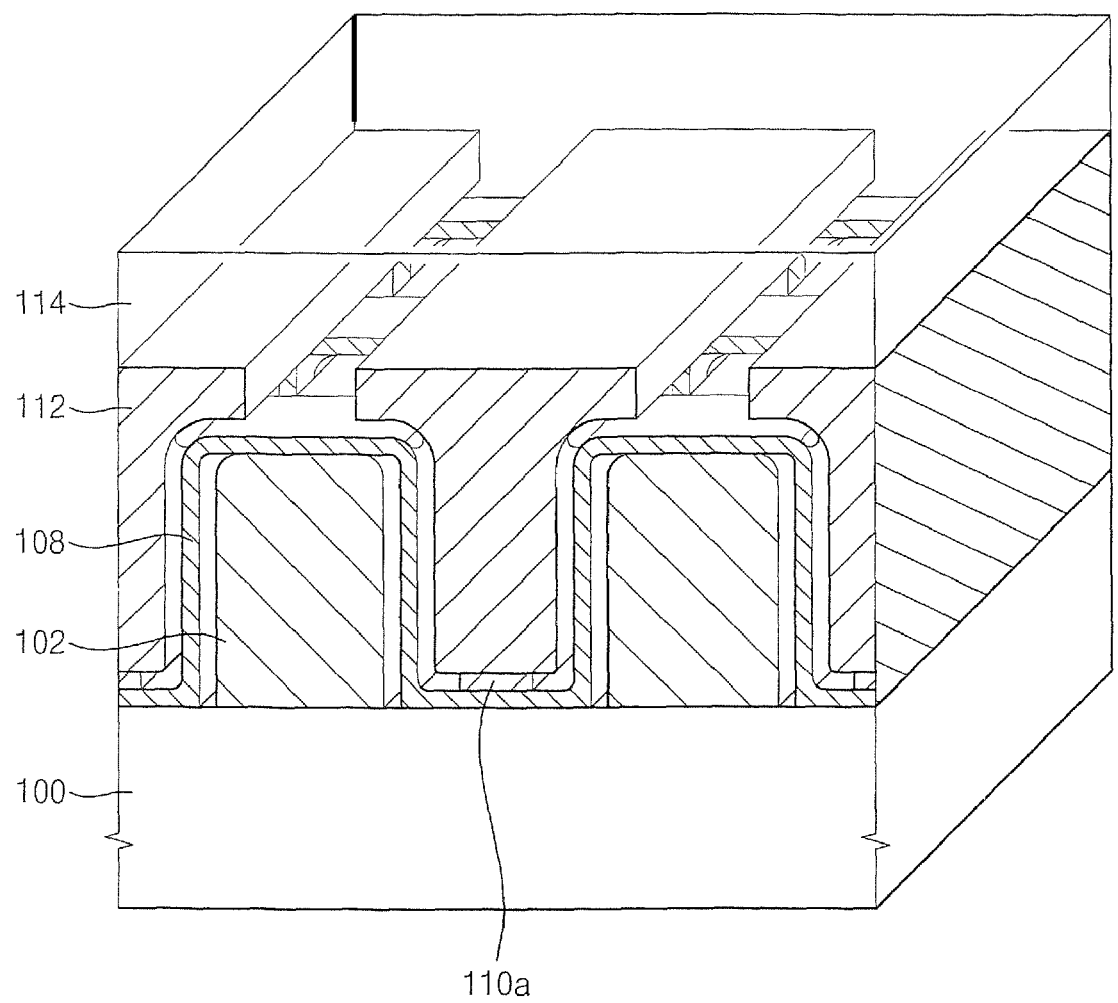
FIG. 23 is a perspective view illustrating electromechanical non-volatile memory devices in accordance with some embodiments of the present invention.

Referring now to FIG. 23, a perspective view illustrating electromechanical non-volatile memory devices in accordance with some embodiments of the present invention will be discussed. The electromechanical non-volatile memory device illustrated in FIG. 23 may be substantially the same as that illustrated in FIG. 1. However, the electromechanical non-volatile memory device of FIG. 23 may not include the charge trap structure provided on the surface of the first electrode pattern. Accordingly, details with respect to like elements of the electromechanical non-volatile memory device of FIG. 23 will be omitted in the interest of brevity.

Methods of manufacturing the electromechanical non-volatile memory device in FIG. 23 is substantially the same as discussed above with respect to FIGS. 2 through 11 except for omitting processes for forming the charge trap structure, thus, the details thereof will also be omitted in the interest of brevity.

As discussed above with respect to FIGS. 1 through 23, electromechanical non-volatile memory devices according to some embodiments of the present invention may perform a stabilized operation and may be manufactured by relatively simple processes. Further, electromechanical non-volatile memory devices according to some embodiments of the present invention may have a superior capacity for storing data due to a charge storage structure provided on a sidewall of an electrode pattern corresponding to a word line used to write the data.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of this invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

That which is claimed is:

1. A method of fabricating an electromechanical non-volatile memory device, the method comprising:
    forming first electrode patterns on a semiconductor substrate including an upper surface having insulation characteristics;
    forming a sacrificial layer pattern on sidewalls of the first electrode patterns;
    forming a bit line on the first electrode patterns and the sacrificial pattern using a conductive material having an elasticity generated by a voltage difference;
    forming an insulating layer on the bit line;
    forming a second electrode pattern in a gap between the first electrode patterns on the insulating layer;
    removing the sacrificial layer pattern and a portion of the insulating layer such that a residual of the insulating layer remains on an upper surface of the bit line formed on the substrate between the first electrode patterns; and
    forming a charge trap structure on the sidewalls and an upper surface of the first electrode pattern, wherein forming the charge trap structure comprises:
        forming a first dielectric layer, a charge trap layer and a second dielectric layer on a surface of the first electrode pattern and a surface of the semiconductor substrate;
        forming a mask pattern on the second dielectric layer formed on an upper surface and the sidewall of the first electrode pattern; and
        etching the second dielectric layer, the charge trap layer and the first dielectric layer on the semiconductor substrate using the mask pattern as an etching mask to form the charge trap structure.

2. The method of claim 1, wherein a width of the second electrode pattern is varied in a vertical line perpendicular to the substrate.

3. The method of claim 2, wherein a width of an upper portion of the second electrode pattern over an upper surface of the first electrode pattern is larger than a width of a lower portion of the second electrode pattern below the upper surface of the first electrode pattern, so that the second electrode pattern is formed into a "T" shape and partially interposed between the first electrode patterns adjacent to each other.

4. The method of claim 1, further comprising forming an insulating interlayer covering upper surfaces of the first electrode patterns and the second electrode pattern.

5. The method of claim 4, wherein forming the insulating interlayer is preceded by filling a space between the first electrode pattern and the bit line and a space between the second electrode pattern and the bit line with nitrogen.

6. The method of claim 4, wherein forming the insulating interlayer is preceded by vacuumizing a space between the first electrode pattern and the bit line and a space between the second electrode pattern and the bit line.

7. A method of forming an electromechanical non-volatile memory device, the method comprising:
    providing a semiconductor substrate having an upper surface including insulation characteristics;
    forming a first electrode pattern on the semiconductor substrate, the first electrode pattern exposing portions of a surface of the semiconductor substrate therethrough;
    forming a conformal bit line on the first electrode pattern and the exposed surface of semiconductor substrate, the bit line being spaced apart from a sidewall of the first electrode pattern and including a conductive material having an elasticity generated by a voltage difference;
    forming an insulating layer pattern on an upper surface of the bit line located on the semiconductor substrate;
    forming a second electrode pattern spaced apart from the bit line and on the insulating layer pattern, the second electrode pattern facing the first electrode pattern; and
    forming a charge trap structure spaced apart from the bit line, thereby providing a space between the bit line and one of the first and the second electrode patterns.

8. The method of claim 7, wherein the charge trap structure is formed on the sidewalls and an upper surface of the first electrode pattern, so that the charge trap structure on the sidewalls of the first electrode pattern is spaced apart from the bit line.

9. The method of claim 8, wherein the bit line contacts the first electrode pattern according to the voltage difference between the bit line and the first electrode pattern.

10. The method of claim 7, wherein the charge trap structure is formed on the sidewalls and a bottom surface of the second electrode pattern, so that the charge trap structure on the sidewalls of the second electrode pattern is spaced apart from the bit line.

11. The method of claim 10, wherein the bit line contacts the second electrode pattern according to the voltage difference between the bit line and the second electrode pattern.

12. The method of claim 7, wherein the charge trap structure includes a multilayer structure having a first dielectric layer, a charge trap layer on the first dielectric layer and a second dielectric layer on the charge trap layer.

13. The method of claim 12, wherein the charge trap layer comprises silicon nitride.

14. The method of claim 7, wherein the first and second electrode patterns extend in a first direction such that the first and second electrode patterns are alternately spaced apart from one another, the bit line being spaced apart from sidewalls of the first and second electrode patterns and having a shape extending along an exposed surface of the semiconductor substrate and first electrode pattern.

15. The method of claim 7, further comprising forming an insulating interlayer on upper surfaces of the first and second electrode patterns.

16. The method of claim 15, before forming the insulating interlayer on upper surfaces of the first and the second electrode patterns, further comprising filling the spaces between the first electrode pattern and the bit line and between the second electrode pattern and the bit line with nitrogen.

17. The method of claim 15, before forming the insulating interlayer on upper surfaces of the first and the second electrode patterns, further comprising vacuumizing the spaces between the first electrode pattern and the bit line and between the second electrode pattern and the bit line.

* * * * *